(12) United States Patent
Matsumoto

(10) Patent No.: US 7,629,855 B2
(45) Date of Patent: Dec. 8, 2009

(54) FREQUENCY-SELECTIVE OSCILLATOR

(75) Inventor: Takashi Matsumoto, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 89 days.

(21) Appl. No.: 11/896,993

(22) Filed: Sep. 7, 2007

(65) Prior Publication Data

US 2008/0074206 A1 Mar. 27, 2008

(30) Foreign Application Priority Data

Sep. 8, 2006 (JP) ............................ P. 2006-244448

(51) Int. Cl.
*H03B 5/36* (2006.01)
(52) U.S. Cl. ........................ 331/49; 331/2; 331/158
(58) Field of Classification Search .............. 331/2, 331/49, 158
See application file for complete search history.

(56) References Cited

U.S. PATENT DOCUMENTS 5,646,580 A * 7/1997 Perkins .................. 331/116 R

FOREIGN PATENT DOCUMENTS

| JP | 2004-070962 | 3/2004 |
| JP | 2005-142966 | 6/2005 |
| WO | 99/26336 | 5/1999 |

* cited by examiner

*Primary Examiner*—Robert Pascal
*Assistant Examiner*—James E Goodley
(74) *Attorney, Agent, or Firm*—Jacobson Holman PLLC

(57) ABSTRACT

The object of the present invention is to provide a frequency-selective oscillator capable of outputting two frequencies without hindering the downsizing of the device and capable of obtaining good output voltage characteristics. The frequency-selective oscillator includes a first crystal resonator and a second crystal resonator different in oscillation frequency from each other, and a first oscillation circuit and a second oscillation circuit corresponding to respective crystal resonators, in which a frequency-switching voltage is applied to selector terminals of the first and second oscillation circuits, a supply voltage Vcc is applied to a switching control terminal of the first oscillation circuit, a switching control terminal of the second oscillation circuit is grounded, Q outputs and inverted Q outputs of the oscillation circuits and are respectively connected and output from respective common signal lines. The frequency-selective oscillator can also be such that the common Q output and the common inverted Q output in the above structure are connected through an inductor L1.

4 Claims, 12 Drawing Sheets

FIG.3
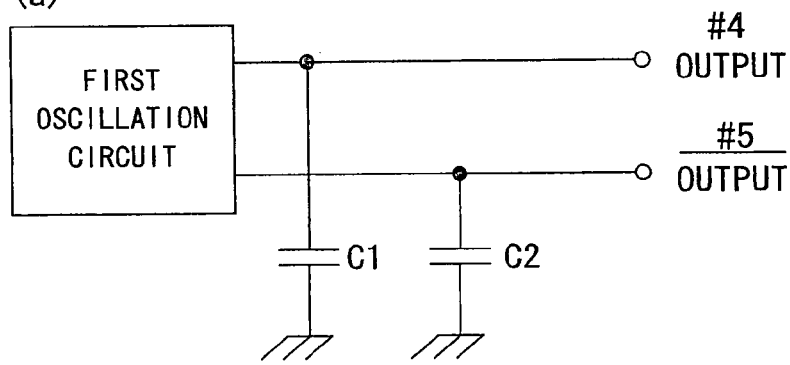
(a)
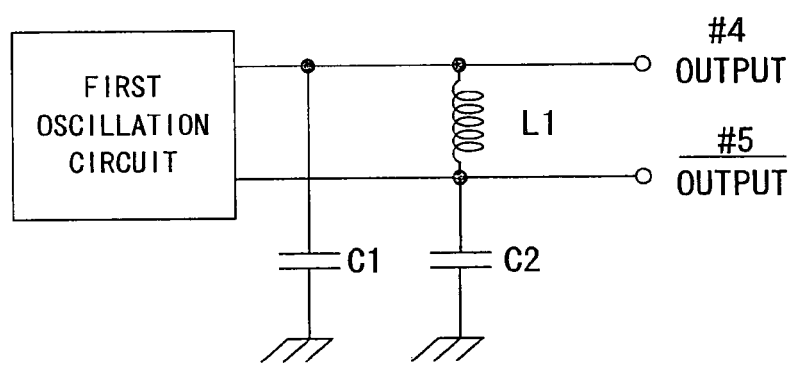
(b)
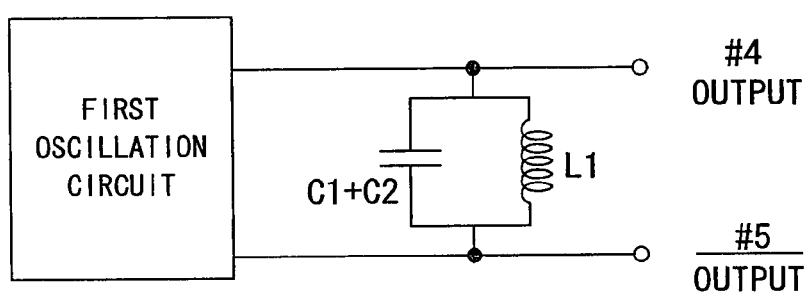
(c)

FIG.6

| F1 | OUTPUT TERMINAL | Voh (V) | Vol (V) | Duty (%) 50% Vout | Duty (%) (at 2.0V) |
|---|---|---|---|---|---|
| F1 | #4 TERMINAL | 2.36 | 1.70 | 53.4 | 56.1 |
|    | #5 TERMINAL | 2.33 | 1.59 | 54.0 | 50.5 |
| F2 | #4 TERMINAL | 2.27 | 1.60 | 49.9 | 44.3 |
|    | #5 TERMINAL | 2.40 | 1.66 | 54.1 | 56.6 |

FIG.9

| F1 | OUTPUT TERMINAL | Voh (V) | Vol (V) | Duty (%) 50% Vout | Duty (%) (at 2.0V) |
|---|---|---|---|---|---|
| F1 | #4 TERMINAL | 2.44 | 1.53 | 52.7 | 51.7 |
|  | #5 TERMINAL | 2.42 | 1.56 | 52.1 | 51.4 |
| F2 | #4 TERMINAL | 2.43 | 1.52 | 52.0 | 50.3 |
|  | #5 TERMINAL | 2.39 | 1.55 | 52.9 | 50.9 |

FREQUENCY-SELECTIVE OSCILLATOR

BACKGROUND OF THE INVENTION

1. Field of the Invention

The present invention relates to a frequency-selective oscillator for outputting two difference frequencies, and more particularly to a compact frequency-selective oscillator capable of obtaining a stable output voltage.

2. Description of the Related Art

Conventional oscillators will be described with reference to FIGS. 10 and 11. FIG. 10 is a schematic diagram showing circuitry and operation timing of a first conventional oscillator, and FIG. 11 is a schematic diagram showing circuitry and operation timing of a second conventional oscillator.

As shown in FIG. 10, the first conventional oscillator is composed of a crystal resonator 1 oscillating a constant frequency, and an oscillation circuit 2 formed as an oscillator IC for tuning and amplifying the frequency from the crystal resonator 1. In this structure, a frequency-switching voltage (SEL) arbitrarily switchable between a high level (High) and a low level (Low) is input to a selector terminal of the oscillation circuit 2, and a supply voltage (Vcc) is input to a switching logic control terminal of the oscillation circuit 2.

In the above-mentioned structure, the first conventional oscillator operates as shown in the operation timing of FIG. 10. In other words, when the frequency-switching voltage (SEL) from the selector terminal is High, an output signal Q of a specific frequency and an inverted signal of Q (inverted Q) are output, while when the frequency-switching voltage is Low, Q and inverted Q are not output.

The second conventional oscillator shown in FIG. 11 is also known as another conventional oscillator.

As shown in FIG. 11, like the above-mentioned first conventional oscillator, the second conventional oscillator is composed of a crystal resonator 3 and an oscillation circuit 4, in which the frequency-switching voltage (SEL) is input to the selector terminal of the oscillation circuit 4, and the switching logic control terminal of the oscillation circuit 4 is connected to ground (GND).

Then, in the above-mentioned structure of the second conventional oscillator, when the frequency-switching voltage (SEL) from the selector terminal is High, Q and inverted Q are not output, while when the frequency-switching voltage is Low, Q and inverted Q are output.

In other words, the first conventional oscillator and the second conventional oscillator are reverse to each other in terms of output timing in response to the same frequency-switching voltage.

As a conventional technique for a crystal oscillator switching and outputting a plurality of frequencies, there is Japanese Patent Application Laid-Open No. 2005-142966 (Applicant: Nippon Dempa Kogyo Co. Ltd.; Inventors: Hiroshi Yoshida and Minoru Fukuda) laid open on Jun. 2, 2005, and entitled "Multi-Frequency Switching Type Crystal Oscillator."

In this conventional technique, the crystal oscillator includes a plurality of crystal resonators different in oscillation frequency from each other, a plurality of oscillation circuits, and a switching unit for selectively switching the oscillation circuits, in which the crystal resonators consist of a plurality of oscillation areas provided on a single crystal blank, the oscillation circuits and the switching unit are integrated in an IC chip, and the crystal blank and the IC chip are hermetically enclosed in the same container. This structure makes it possible to provide a compact, surface-mounted, multi-frequency switching oscillator.

As other conventional oscillators, there are disclosed in published Japanese translation No. 2001-523908 of a PCT international publication and Japanese Patent Application Laid-Open No. 2004-070962.

However, the first conventional oscillator and the second conventional oscillator can both output only a specific frequency, determined by the crystal resonator and the oscillation circuit, and its inverted frequency. Therefore, in order to output two different frequencies, two conventional oscillators are needed as separate devices, resulting in a problem of hindering the downsizing of the entire device.

SUMMARY OF THE INVENTION

The present invention has been made in view of the actual conditions, and it is an object thereof to provide a frequency-selective oscillator capable of outputting two frequencies without hindering the downsizing of the device and capable of obtaining good output voltage characteristics.

The present invention made to solve the above-mentioned conventional problem provides a frequency-selective oscillator comprising: a first crystal resonator oscillating a first frequency; a first oscillation circuit connected to the first crystal resonator; a second crystal resonator oscillating a second frequency; and a second oscillation circuit connected to the second crystal resonator, wherein a common frequency-switching voltage signal is applied to selector terminals of the first oscillation circuit and the second oscillation circuit, a supply voltage is applied to a switching control terminal of the first oscillation, circuit, a switching control terminal of the second oscillation circuit is grounded, and the output of the first oscillation circuit and the output of the second oscillation circuit are connected and output from a common signal line, whereby first and second different frequencies can be output without hindering the downsizing of the oscillator.

According to the present invention, the above-mentioned frequency-selective oscillator can be such that a first common signal line and a second common signal line are connected through an inductor. In this structure, there is no electric potential difference between the first and second common signal lines, so that the DC level fluctuation can be eliminated and hence the duty cycle can be improved, thereby obtaining good output voltage characteristics.

Further, according to the present invention, the above-mentioned frequency-selective oscillator can be such that the impedance of the inductor is set to compensate for the impedance of parasitic capacitance generated between the first common signal line and the second common signal line. In this structure, the influence of parasitic capacitance can be reduced to prevent the amplitude of the output signal from being decreased, thereby obtaining good output voltage characteristics.

BRIEF DESCRIPTION OF THE DRAWING

FIG. 3(*a*) is a schematic circuit diagram for explaining parasitic capacitance existing in the first circuitry, FIG. 3(*b*) is a schematic circuit diagram of the second circuitry, and FIG. 3(*c*) is an equivalent circuit diagram of FIG. 3(*b*).

FIG. 6 is a table showing characteristic values of the first circuitry.

FIG. 9 is a table showing characteristic values of the second circuitry.

Figure 1:
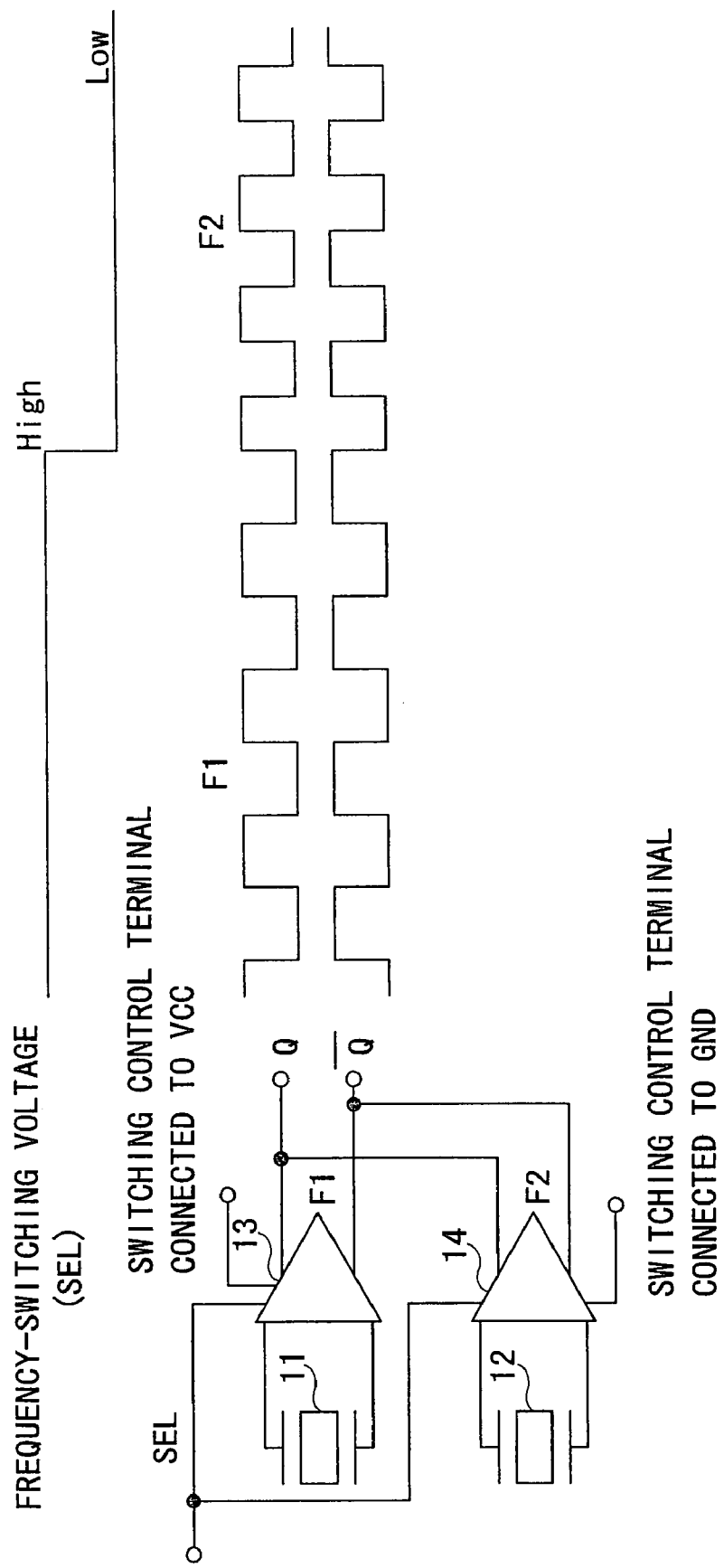
FIG. 1 is a schematic diagram showing circuitry and operation timing of a frequency-selective oscillator (first circuitry) according to a first embodiment of the present invention.

DESCRIPTION OF REFERENCE NUMERALS 1, 3, 11, 13 . . . Crystal Resonator, 2, 4, 12, 14 . . . Oscillation Circuit

DESCRIPTION OF THE PREFERRED EMBODIMENT

Embodiments of the present invention will now be described with reference to the accompanying drawings.

A frequency-selective oscillator according to an embodiment of the present invention comprises: a first crystal resonator having a first oscillation frequency; a second crystal resonator having a second oscillation frequency; and a first oscillation circuit and a second oscillation circuit connected to respective crystal resonators, wherein a common frequency-switching voltage is applied to selector terminals of the first and second oscillation circuits, a supply voltage (Vcc) is applied to a switching logic control terminal of the first oscillation circuit, a switching logic control terminal of the second oscillation circuit is grounded, Q output of the first oscillation circuit and Q output of the second oscillation circuit are connected to provide common Q output, and inverted Q output of the first oscillation circuit and inverted Q output of the second oscillation circuit are connected to provide common inverted Q output. In this structure, when the frequency-switching voltage is High, Q of a first frequency and inverted Q are output from the first oscillation circuit, while when the frequency-switching voltage is Low, Q of a second frequency and inverted Q are output from the second oscillation circuit, enabling output of two different frequencies with a single device structure in a time-division manner.

Further, a frequency-selective oscillator according to another embodiment of the present invention is such that an inductor is connected between the common Q output and the common inverted Q output in the frequency-selective oscillator structured as mentioned above. This structure can reduce parasitic capacitance to prevent the output amplitude from being decreased.

A frequency-selective oscillator according to a first embodiment of the present invention will be described with reference to FIG. 1. FIG. 1 is a schematic diagram showing circuitry and operation timing of a frequency-selective oscillator (first circuitry) according to the first embodiment of the present invention.

As shown in FIG. 1, the first circuitry is composed of a first crystal resonator 11 and a second crystal resonator 12, and a first oscillation circuit 13 and a second oscillation circuit 14.

The first crystal resonator 11 oscillates a first oscillation frequency, and the second crystal resonator 12 oscillates a second oscillation frequency.

Further, the first oscillation circuit 13 tunes and amplifies the oscillation frequency from the first crystal resonator 11 to a desired value F1, while the second oscillation circuit 14 tunes and amplifies the oscillation frequency from the second crystal resonator 12 to a desired value F2.

In this structure, a common frequency-switching voltage (SEL) is applied to selector terminals of the first oscillation circuit 13 and the second oscillation circuit 14.

Further, a switching control terminal of the first oscillation circuit 13 is connected to a supply voltage (Vcc), and a switching control terminal of the second oscillation circuit 14 is connected to GND.

Then, in this first circuitry, Q output of the first oscillation circuit 13 and Q output of the second oscillation circuit are connected to produce Q output of the first circuitry, while inverted Q output of the first oscillation circuit 13 and inverted Q output of the second oscillation circuit are connected to produce inverted Q output of the first circuitry.

Figure 10:
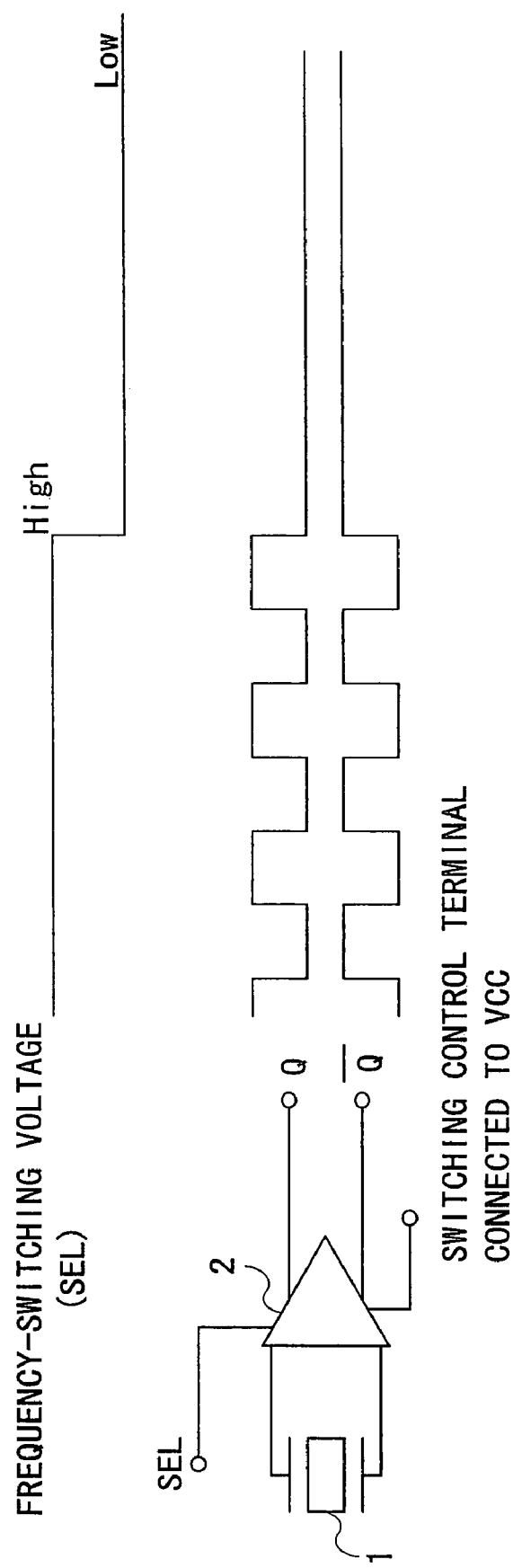
FIG. 10 is a schematic diagram showing circuitry and operation timing of a first conventional oscillator.
Figure 11:
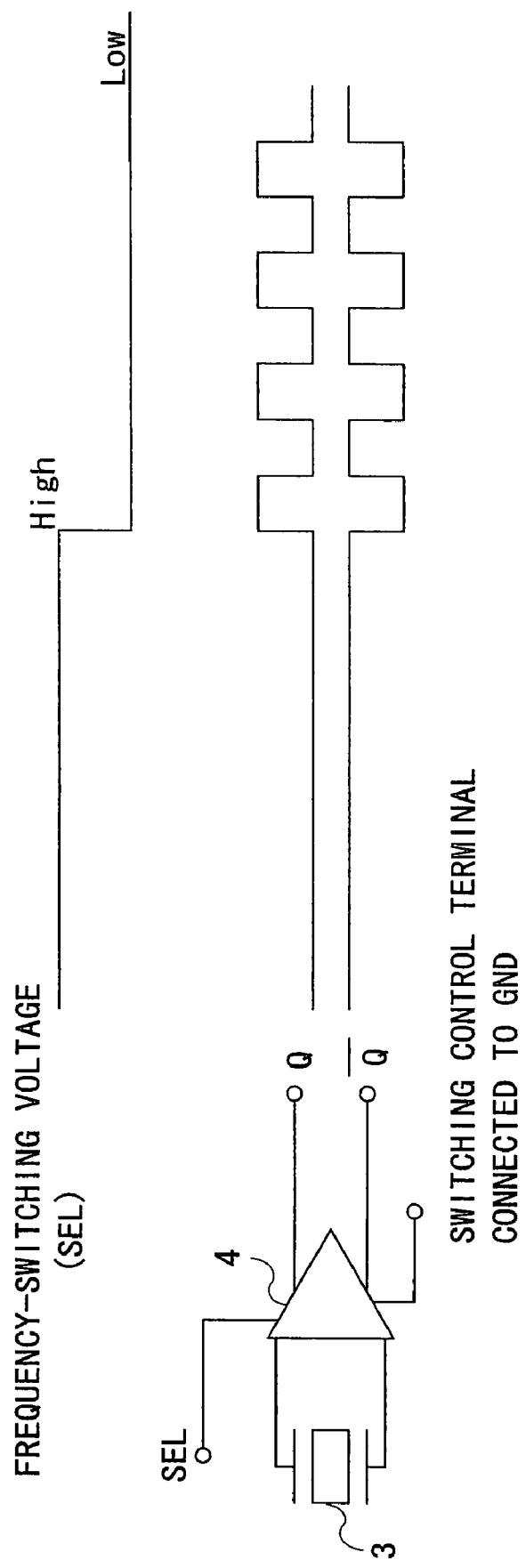
FIG. 11 is a schematic diagram showing circuitry and operation timing of a second conventional oscillator.

In other words, the first circuitry has a structure in which the first conventional oscillator shown in FIG. 10 and the second conventional oscillator shown in FIG. 11 are so connected that both Q outputs and both inverted Q outputs are connected.

The operation timing of the first circuitry thus structured will be described with reference to FIG. 1.

As described above with reference to FIG. 10, when the frequency-switching voltage is High, the first oscillation circuit 13 (corresponding to the first conventional oscillator of FIG. 10) outputs Q and inverted Q, while when the frequency-switching voltage is Low, it outputs none of them. On the contrary to the first oscillation circuit 13, as shown in FIG. 11, the second oscillation circuit 14 (corresponding to the second conventional oscillator of FIG. 11) outputs Q and inverted Q when the frequency-switching voltage is Low, while it outputs none of them when the frequency-switching voltage is High.

Therefore, the Q output of the first circuitry in which both the Q outputs of the first oscillation circuit 13 and the second oscillation circuit 14 are connected is configured such that when the frequency-switching voltage is High, frequency F1 from the first oscillation circuit 13 is output, while when the frequency-switching voltage is Low, frequency F2 from the second oscillation circuit 14 is output.

Similarly, the inverted Q output of the first circuitry is configured such that when the frequency-switching voltage is High, frequency F1 from the first oscillation circuit 13 is output, while when the frequency-switching voltage is Low, frequency F2 from the second oscillation circuit 14 is output.

This allows a single device to output two different frequencies F1 and F2 in a time-division manner.

The frequency-selective oscillator according to the first embodiment of the present invention includes the first crystal resonator 11 and the second crystal resonator 12 different in oscillation frequency, and the first oscillation circuit 13 and the second oscillation circuit 14 corresponding to respective crystal resonators. In this structure, the frequency-switching voltage is applied to the selector terminals of the first and second oscillation circuits, the supply voltage Vcc is applied to the switching control terminal of the first oscillation circuit 13, the switching control terminal of the second oscillation circuit 14 is grounded, the Q outputs of the two oscillation circuits are connected to provide the common Q output, and the inverted Q outputs are connected to provide the common inverted Q output. Therefore, when the frequency-switching voltage is High, Q and inverted Q are output with the frequency F1 from the first oscillation circuit 13, while when the frequency-switching voltage is Low, Q and inverted Q are output with the frequency F2 from the second oscillation circuit 14. This structure has the advantage of outputting two frequencies without hindering the downsizing of the device.

A frequency-selective oscillator according to a second embodiment of the present invention will next be described.

Figure 2:
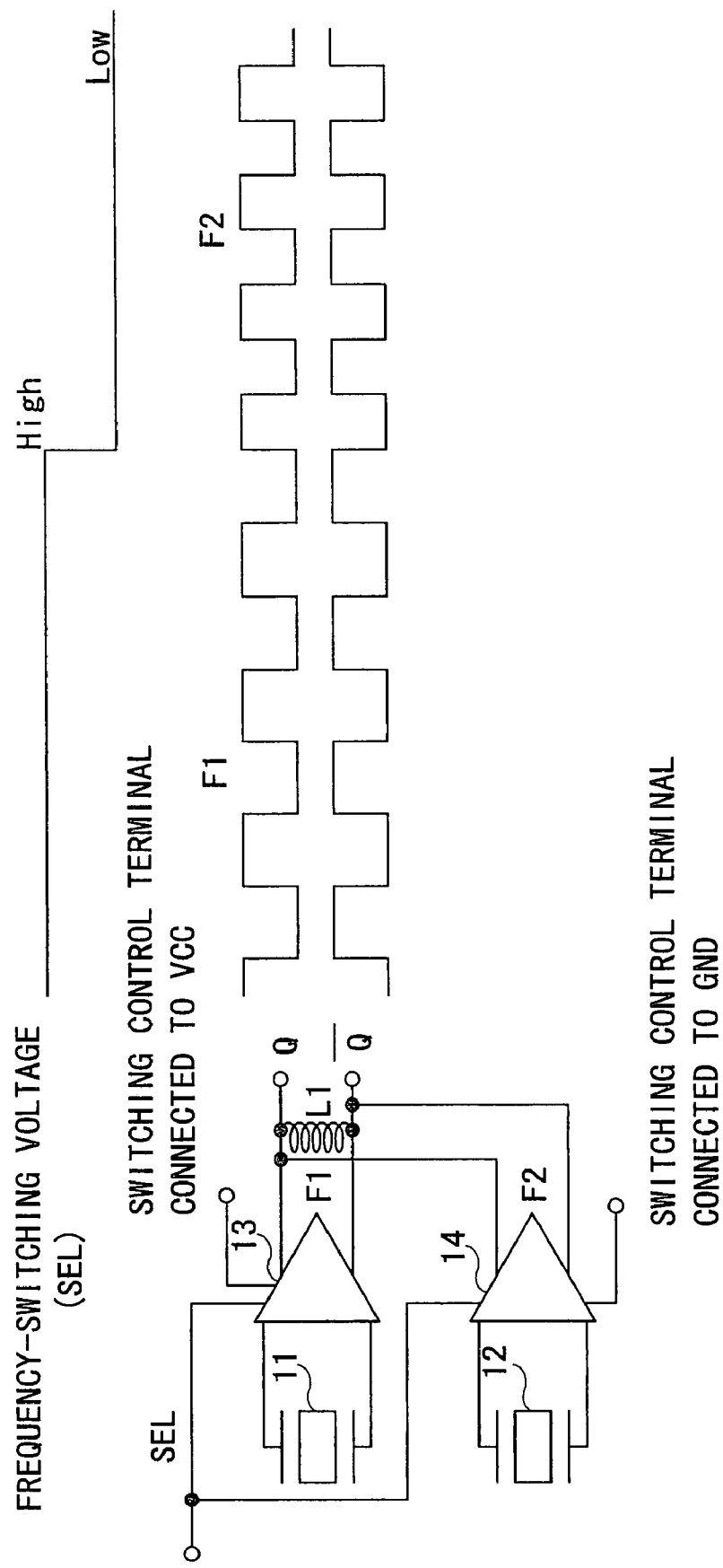
FIG. 2 is a schematic diagram showing circuitry and operation timing of a frequency-selective oscillator (second circuitry) according to a second embodiment of the present invention.

FIG. 2 is a schematic diagram showing circuitry and operation timing of a frequency-selective oscillator (second circuitry) according to the second embodiment of the present invention.

As shown in FIG. 2, the second circuitry has such a structure that the Q output and the inverted Q output of the first circuitry shown in FIG. 1 are connected through an inductor L1 for the purpose of improving the output characteristics of the first circuitry. Note that, since the structural components and operation timing of the second circuitry are the same as those of the first circuitry except for the inductor L1, redundant description thereof will be omitted.

Since the first circuitry shown in FIG. 1 outputs signals alternately from the two oscillation circuits, the output amplitude could be decreased due to the influence of parasitic capacitance of the oscillation stopping oscillation circuit at the time (i.e., of a transistor on the oscillation stopping side).

Figure 12:
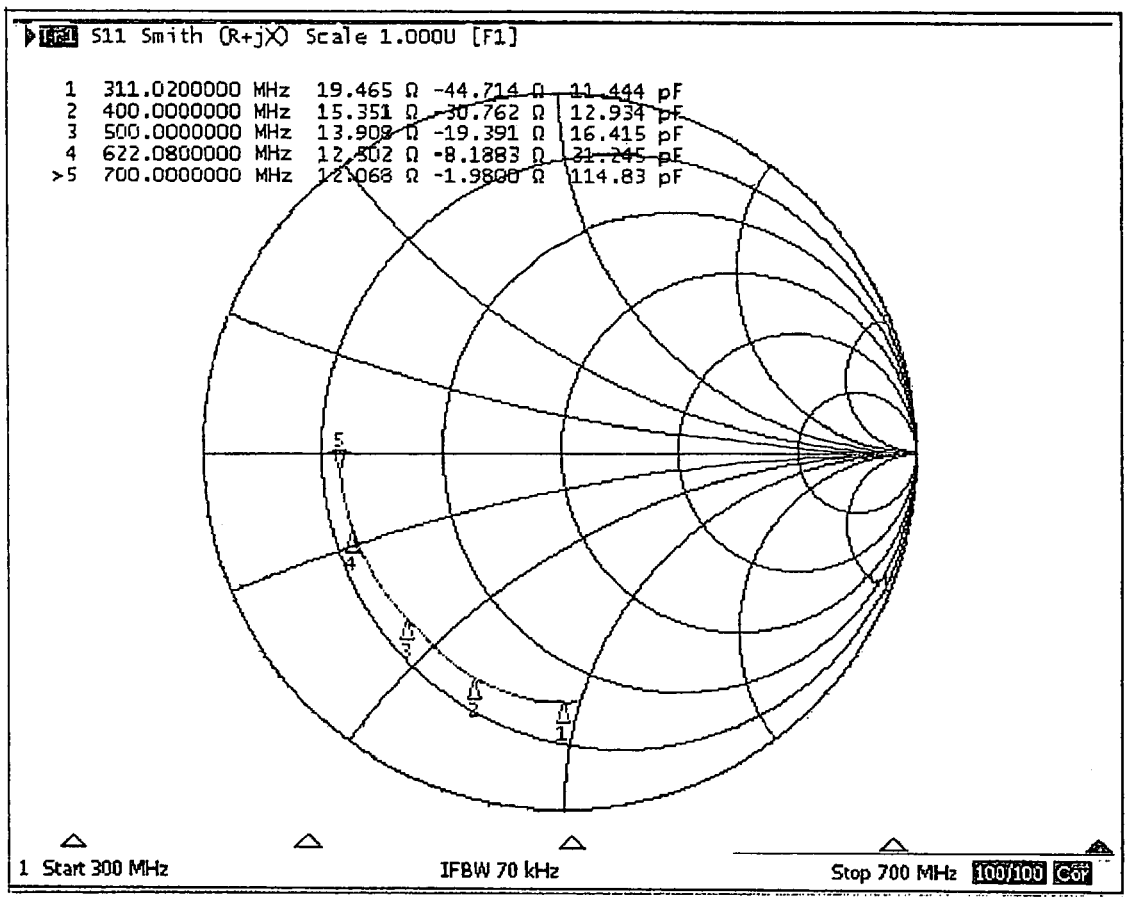
FIG. 12 is a Smith chart showing impedance in the first circuitry.

The influence of parasitic capacitance and the effect of the inductor in the second circuitry will be described below with reference to FIGS. 3 and 12. FIG. 3(a) is a schematic circuit diagram for explaining parasitic capacitance existing in the first circuitry, FIG. 3(b) is a schematic circuit diagram of the second circuitry, and FIG. 3(c) is an equivalent circuit diagram of FIG. 3(b). Further, FIG. 12 is a Smith chart showing impedance in the first circuitry.

For example, as shown in FIG. 3(a), parasitic capacitance C1 and C2 is generated in the first circuitry shown in FIG. 1. Specifically, the output terminal impedance when the output is stopped at 622.08 MHz in the first circuitry is 12.5-j8.18 from the Smith chart in FIG. 12. It means that parasitic capacitance of 31 pF is present. The impedance of this case is given as $|Z|=\sqrt{(12.5^2+8.18^2)}=15$ ohms. Thus, since the impedance is such a small value of 15 ohms, it affects the output terminal.

For this reason, as shown in FIG. 3(b), in the second circuitry, Q output (#4 OUTPUT) and inverted Q output (#5 OUTPUT) are connected through the inductor L1.

Here, it is considered that the parasitic capacitance C1 of the Q output line and the parasitic capacitance C2 of the inverted Q output line are not connected in parallel through GND because they are connected via the inductor L1. Therefore, the equivalent circuit of FIG. 3(b) will be the circuit shown in FIG. 3(c).

Impedance ZC of parasitic capacitance in this circuit is represented as:

$$ZC = -j*1/(2*\text{PI}*Freq*C)$$
$$= -j*1/(2*3.14*622E+6*15.5E-12)$$
$$= -j16.5 \text{ ohms}.$$

In other words, impedance ZL of the inductance L of the inductor L1 to compensate for the impedance ZC of the parasitic capacitance is +j16.5 ohms.

The inductance L can be determined as:

from $j16.5=j\omega L=j*2*PI*\text{Freq}*L$, $L=j16.5/j(2*PI*\text{Freq})=16.5/(2*PI*\text{Freq})=4.22$ nH.

Then, upon actual assembling of the circuit, inductance L as close to 4.22 nH as possible is selected for the inductor L1.

For example, if the inductance of the inductor L1 is 4.3 nH, the impedance ZL of the inductor L1 is:

$$ZL = +j*(2*\text{PI}*Freq*L)$$
$$= +j*(2*3.14*622E+6*4.3E-9)$$
$$= +j16.8 \text{ ohms}.$$

As a result, total impedance Ztotal in the second circuitry is given by:

$$Ztotal = ZC*ZL/(ZC+ZL)$$
$$= (-j16.5*j16.8)/(-j16.5+j16.8)$$
$$= -j924 \text{ ohms}.$$

In comparison to the first circuitry (15 ohms), the output impedance is significantly increased, so that the influence of the oscillation-stopping transistor on the output is reduced, thereby reducing the parasitic capacitance from 15.5 pF that is coupling capacitance of C1 and C2 to 0.3 pF.

Thus, since the inductor L1 connecting Q and inverted Q is provided in the second circuitry, the parasitic capacitance becomes small, making it possible to increase the amplitude.

In addition, in the first circuitry, the DC level may fluctuate to distort the duty cycle.

With this problem, since Q and QB (inverted Q) are connected through the inductor L1 in the second circuitry, Q and inverted Q become the same electric potential, so that no DC level fluctuation occurs, thereby improving the duty cycle.

Figure 4:
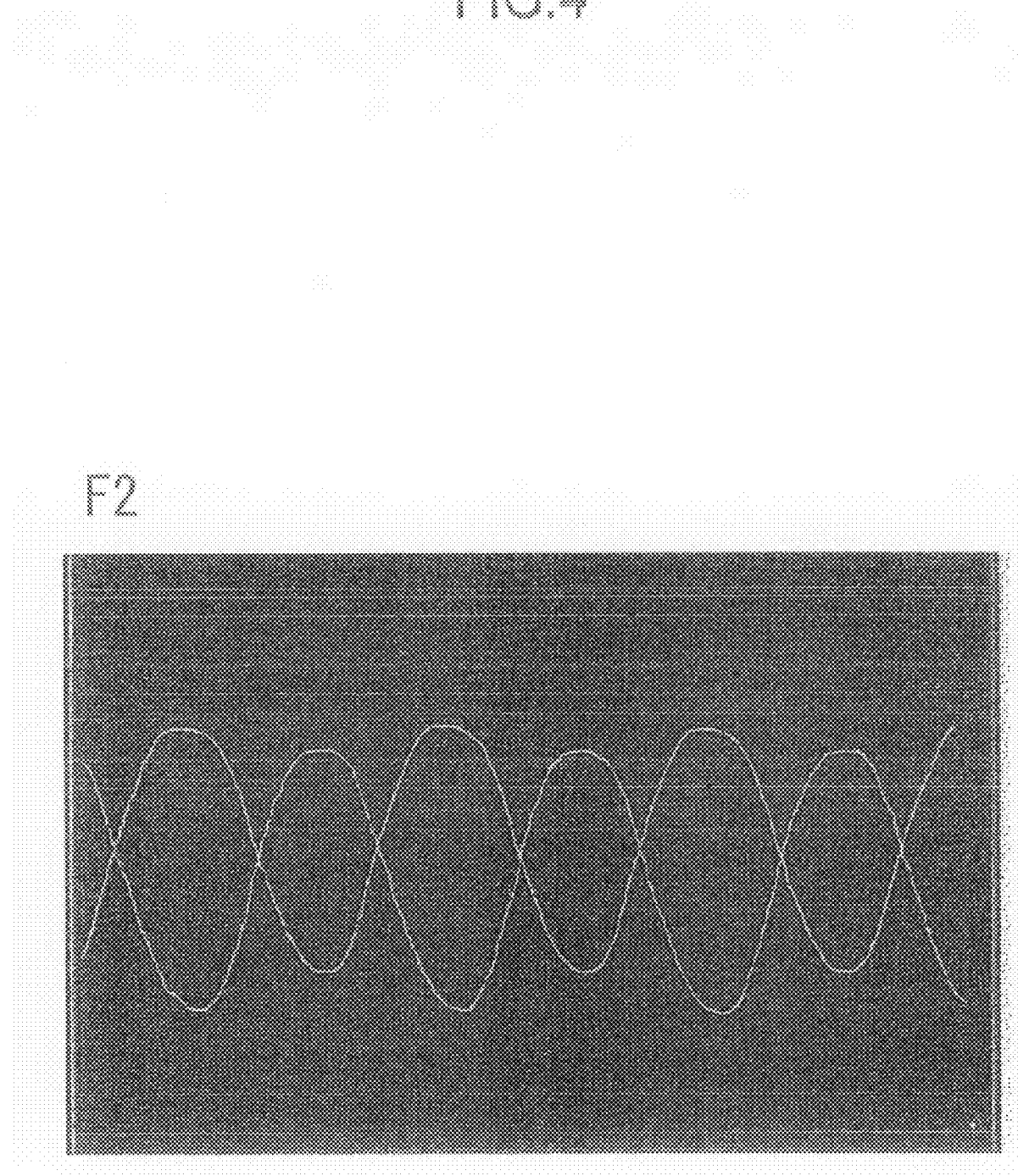
FIG. 4 is an output waveform chart of frequency F2 in the first circuitry.
Figure 5:
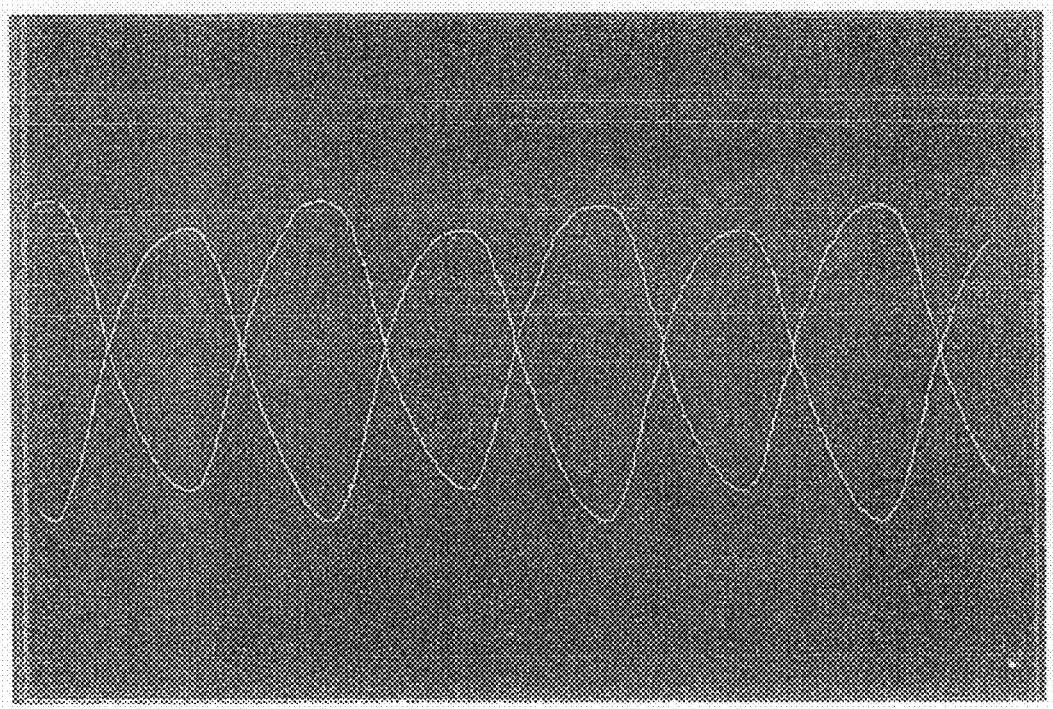
FIG. 5 is an output waveform chart of frequency F1 in the first circuitry.
Figure 7:
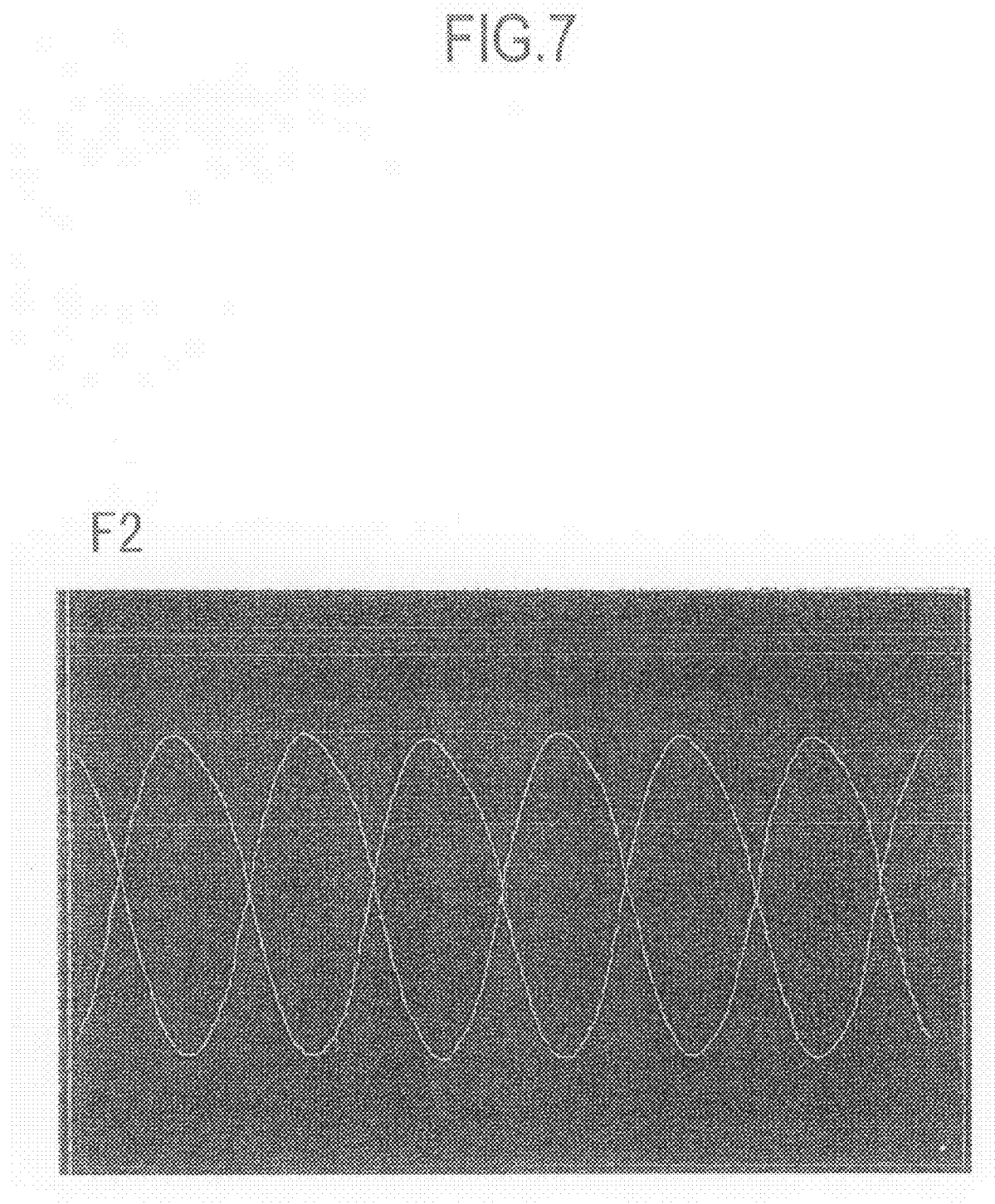
FIG. 7 is an output waveform chart of frequency F2 in the second circuitry.
Figure 8:
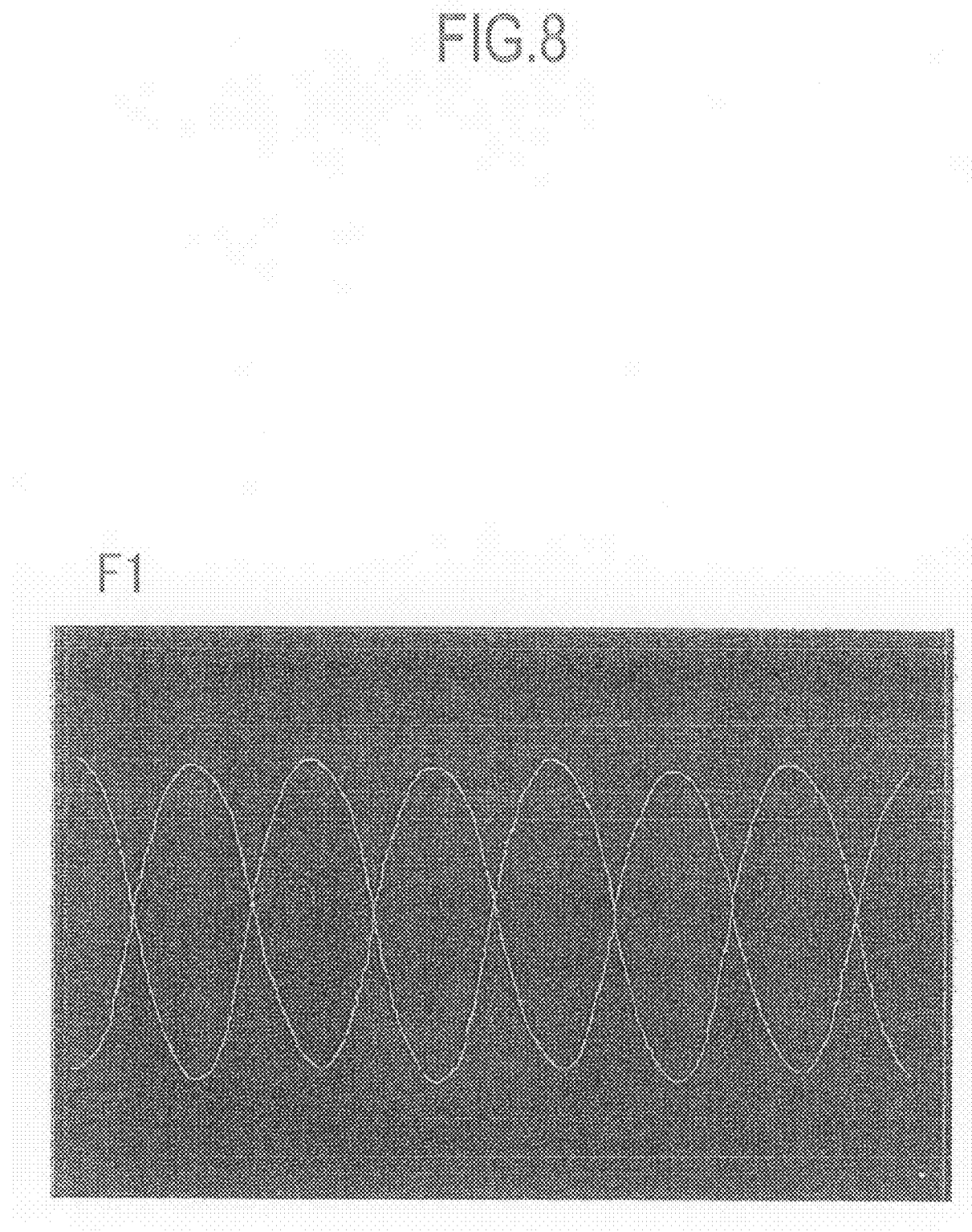
FIG. 8 is an output waveform chart of frequency F1 in the second circuitry.

FIGS. 4 to 9 show measurement results of the output voltage characteristics of the first circuitry and the second circuitry of the present invention. FIG. 4 is an output waveform chart of frequency F2 in the first circuitry, FIG. 5 is an output waveform chart of frequency F1 in the first circuitry, and FIG. 6 is a table showing characteristic values of the first circuitry. Further, FIG. 7 is an output waveform chart of frequency F2 in the second circuitry, FIG. 8 is an output waveform chart of frequency F1 in the second circuitry, and FIG. 9 is a table showing characteristic values of the second circuitry. Note that FIGS. 4, 5, and 7, 8 show time on the abscissa and voltage on the ordinate.

It is understood from the comparison between FIG. 4 and FIG. 7 that the output amplitude of frequency F2 is greater and the waveform is more uniform in the second circuitry (with L1) shown in FIG. 7.

Similarly, the comparison between FIG. 5 and FIG. 8 also shows that the output amplitude of frequency F1 is greater and the waveform is more uniform in the second circuitry.

Further, the comparison between FIG. 6 and FIG. 9 in terms of frequency F1 shows that Voh is 2.36(V) and Vol is 1.70(V) at #4 terminal of the first circuitry (without L1) shown in FIG. 6 and hence Voh−Vol=0.66(V), while Voh is 2.44(V) and Vol is 1.53(V) at #4 terminal of the second circuitry (with L1) shown in FIG. 9 and hence Voh−Vol=0.91 (V). It is therefore understood that the second circuitry significantly increases the amplitude compared to the first circuitry.

The same thing can be said about frequency F2. In other words, Voh is 2.27(V) and Vol is 1.60(V) at #4 terminal of the first circuitry (without L1) shown in FIG. 6, while Voh is 2.43(V) and Vol is 1.52(V) at #4 terminal of the second circuitry (with L1) shown in FIG. 9. It is therefore understood that the second circuitry significantly increases the amplitude compared to the first circuitry.

Further, it can be found from the comparison of duty ratios between FIG. 6 and FIG. 9 that, while the variation in the duty ratio of the first circuitry shown in FIG. 6 is large, the duty ratio of the second circuitry is near 50 percent at any of the frequencies and its variation is reduced compared to that of the first circuitry.

Thus, the amplitude is large in the second circuitry compared to that in the first circuitry, and no duty cycle distortion occurs in the second circuitry, resulting in improvement of the output voltage characteristics.

In the frequency-selective oscillator according to the second embodiment of the present invention, since the Q output and the inverted Q output in the first frequency-selective oscillator are connected through the inductor L1, the parasitic capacitance resulting from the oscillation-stopping oscillator circuit is significantly reduced to increase the output amplitude. Further, the Q output and the inverted Q output are so connected that they become the same electric potential to make the DC level equal to each other in order to eliminate variations in duty cycle. Thus, the frequency-selective oscillator according to the second embodiment has the advantage of being able to further improve output signal characteristics.

The present invention is suitable for compact frequency-selective oscillators capable of obtaining stable output voltage.

What is claimed is:

1. A frequency-selective oscillator comprising:
a first crystal resonator oscillating at a first frequency; a first oscillation circuit connected to the first crystal resonator; a second crystal resonator oscillating at a second frequency; and a second oscillation circuit connected to the second crystal resonator, wherein
a common frequency-switching voltage signal is applied to selector terminals of the first oscillation circuit and the second oscillation circuit,
a supply voltage is applied to a switching control terminal of the first oscillation circuit,
a switching control terminal of the second oscillation circuit is grounded,
output of the first oscillation circuit and output of the second oscillation circuit are connected and output from a first common signal line, and inverted output of the first oscillation circuit and inverted output of the second oscillation circuit are connected and output from a second common signal line, and
the first common signal line and the second common signal line are connected through an inductor.

2. A frequency-selective oscillator comprising:
a first crystal resonator oscillating at a first frequency; a first oscillation circuit connected to the first crystal resonator; a second crystal resonator oscillating at a second frequency; and a second oscillation circuit connected to the second crystal resonator, wherein
a common frequency-switching voltage signal is applied to selector terminals of the first oscillation circuit and the second oscillation circuit,
a supply voltage is applied to a switching control terminal of the first oscillation circuit,
a switching control terminal of the second oscillation circuit is grounded,
output of the first oscillation circuit and output of the second oscillation circuit are connected and output from a first common signal line, and inverted output of the first oscillation circuit and inverted output of the second oscillation circuit are connected and output from a second common signal line,
the first common signal line and the second common signal line are connected through an inductor,
a high-level voltage and a low-level voltage are applied as the frequency-switching voltage signal,
the first oscillation circuit outputs a first oscillation frequency from the common signal line when the frequency-switching voltage signal is at the high level, and
the second oscillation circuit outputs a second oscillation frequency from the common signal line when the frequency-switching voltage signal is at the low level.

3. The frequency-selective oscillator according to claim 1, wherein impedance of the inductor is set to compensate for impedance of parasitic capacitance generated between the first common signal line and the second common signal line.

4. The frequency-selective oscillator according to claim 2, wherein impedance of the inductor is set to compensate for impedance of parasitic capacitance generated between the first common signal line and the second common signal line.

* * * * *